United States Patent
Bae et al.

(10) Patent No.: US 10,442,960 B2
(45) Date of Patent: Oct. 15, 2019

(54) ADHESIVE FILM AND ORGANIC ELECTRONIC DEVICE COMPRISING THE SAME

(71) Applicant: LG CHEM, LTD., Seoul (KR)

(72) Inventors: Kyung Yul Bae, Daejeon (KR); Yoon Gyung Cho, Daejeon (KR); Hyun Jee Yoo, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/580,498

(22) PCT Filed: Jun. 9, 2016

(86) PCT No.: PCT/KR2016/006131
§ 371 (c)(1),
(2) Date: Dec. 7, 2017

(87) PCT Pub. No.: WO2016/200180
PCT Pub. Date: Dec. 15, 2016

(65) Prior Publication Data
US 2018/0171181 A1    Jun. 21, 2018

(30) Foreign Application Priority Data

Jun. 9, 2015 (KR) .................. 10-2015-0081475
Aug. 20, 2015 (KR) .................. 10-2015-0117379

(51) Int. Cl.
| | |
|---|---|
| C09J 7/38 | (2018.01) |
| C09J 4/00 | (2006.01) |
| C09J 123/22 | (2006.01) |
| C09J 7/20 | (2018.01) |
| H01L 51/00 | (2006.01) |

(Continued)

(52) U.S. Cl.
CPC .......... *C09J 7/381* (2018.01); *C08G 59/4007* (2013.01); *C09J 4/00* (2013.01); *C09J 4/06* (2013.01); *C09J 7/20* (2018.01); *C09J 7/30* (2018.01); *C09J 109/00* (2013.01); *C09J 123/22* (2013.01); *C09J 163/00* (2013.01); *H01L 51/004* (2013.01); *H01L 51/0043* (2013.01); *H01L 51/0097* (2013.01); *H01L 51/5246* (2013.01); *H01L 51/5253* (2013.01); *H05K 1/028* (2013.01); *H05K 1/0313* (2013.01); *H05K 3/285* (2013.01); *C08F 2500/01* (2013.01); *C08F 2500/02* (2013.01); *C09J 11/08* (2013.01); *C09J 2203/326* (2013.01); *C09J 2423/00* (2013.01); *C09J 2425/00* (2013.01); *C09J 2463/00* (2013.01); *H01L 2251/5338* (2013.01); *Y02E 10/549* (2013.01)

(58) Field of Classification Search
None
See application file for complete search history.

(56) References Cited

FOREIGN PATENT DOCUMENTS

| | | |
|---|---|---|
| JP | 2012-056971 A | 3/2012 |
| JP | 2014-194942 A | 10/2014 |

(Continued)

*Primary Examiner* — Michelle Mandala
(74) *Attorney, Agent, or Firm* — Dentons US LLP (57) ABSTRACT

The present application relates to an adhesive film, an organic electronic device comprising same, and a lighting apparatus and a display device comprising same. The present application enables an organic electronic device to show excellent moisture-blocking properties and have flexibility as well as excellent and reliable durability at high temperature and high humidity.

20 Claims, 2 Drawing Sheets

(51) Int. Cl.
  *H01L 51/52*    (2006.01)
  *C09J 109/00*   (2006.01)
  *C09J 163/00*   (2006.01)
  *H05K 1/02*     (2006.01)
  *H05K 1/03*     (2006.01)
  *C09J 7/30*     (2018.01)
  *C08G 59/40*    (2006.01)
  *C09J 4/06*     (2006.01)
  *H05K 3/28*     (2006.01)
  *C09J 11/08*    (2006.01)

(56)   References Cited

FOREIGN PATENT DOCUMENTS

| | | |
|---|---|---|
| JP | 2016520138 A | 7/2016 |
| KR | 10-2008-0088606 A | 10/2008 |
| KR | 10-2012-0091349 A | 8/2012 |
| KR | 10-2015-0010667 A | 1/2015 |
| KR | 10-2015-0033582 B1 | 4/2015 |
| WO | 2013/156271 A1 | 10/2013 |
| WO | 2014084352 A1 | 6/2014 |
| WO | 2014/190151 A1 | 11/2014 |
| WO | 2013108731 A1 | 5/2015 |
| WO | 2014017524 A1 | 7/2016 |

ADHESIVE FILM AND ORGANIC ELECTRONIC DEVICE COMPRISING THE SAME

CROSS-REFERENCE TO RELATED APPLICATIONS

This application is a National Stage Entry of International Application No. PCT/KR2016/006131 filed on Jun. 9, 2016, and claims the benefit of Korean Application No. 10-2015-0081475 filed on Jun. 9, 2015, and Korean Patent Application No. 10-2015-0117379 filed on Aug. 20, 2015, all of which are hereby incorporated by reference in their entirety for all purposes as if fully set forth herein.

TECHNICAL FIELD

The present invention relates to an adhesive film, an organic electronic device comprising the same, and a lighting apparatus and a display device comprising the same.

BACKGROUND ART

An organic electronic device (OED) means a device comprising an organic material layer. An example of the organic electronic device may include a photovoltaic device, a rectifier, a transmitter, and an organic light emitting diode (OLED), and the like.

In one embodiment, the organic light emitting diode (OLED) has a lower power consumption and a faster response speed than an existing light source, and is advantageous for thinning display devices or illuminations. The OLEDs are also expected to be applied in various fields covering various portable devices, monitors, notebooks, and televisions because of their excellent space utilization.

Recently, in the display field, weight reduction, miniaturization and flexibilization of products have been emphasized, but since the glass substrates currently used have disadvantages that they are heavy, fragile and difficult to be continuously processed, researches for applying plastic substrates having advantages of being light and flexible, and allowing the continuous process by replacing the glass substrate to mobile phones, notebooks, and PDAs and the like are actively underway.

DISCLOSURE

Technical Problem

The present application provides a flexible organic electronic device that does not only realize excellent moisture barrier characteristics, but also has excellent endurance reliability under high temperature and high humidity conditions while having flexible characteristics, and provides an adhesive film applied to the flexible organic electronic device.

Technical Solution

Hereinafter, embodiments of the present invention will be described in more detail with reference to the accompanying drawings. Also, in describing the present invention, detailed descriptions of known general purpose functions and configurations incorporated herein are omitted. Also, the accompanying drawings are those that are schematic for helping the understanding of the present invention, where parts that are not related to the description have been omitted for more clearly explaining the present invention. In the drawings, the thickness or size has been shown in an enlarged scale in order to clearly represent layers and regions. The scope of the present invention is not limited by the thickness, size, ratio and the like as shown in the drawings.

The present application relates to an adhesive film. The adhesive film may be applied to an organic electronic device having flexible characteristics. For example, the adhesive film may seal the entire surface of an organic electronic element in the organic electronic device to protect the element from moisture or oxygen. Considering that the adhesive film according to the present invention is applied to a flexible organic electronic device, physical properties, in which the flexible organic electronic device can effectively suppress cracks capable of occurring in the organic electronic device despite several folding processes and can maintain excellent luminance even after folding, while relaxing stress caused by folding, are required for the adhesive constituting the adhesive film.

In this specification, the term "organic electronic device" means an article or device having an element comprising an organic material layer that generates alternate current of charges using holes and electrons between a pair of electrodes opposing to each other, and the example thereof may include, but is not limited to, a photovoltaic device, a rectifier, a transmitter and an organic light emitting diode (OLED), and the like. In one example of the present invention, the organic electronic device may be an OLED.

The term adhesive herein is a term encompassing not only a material commonly referred to as an adhesive but also a layer formed by using a material referred to as a so-called pressure-sensitive adhesive or a material referred to as a so-called adhesive and pressure-sensitive adhesive, and the like.

The adhesive film according to the present application comprises an adhesive layer, wherein the adhesive layer may comprise a polymer derived from butylene.

Figure 3:
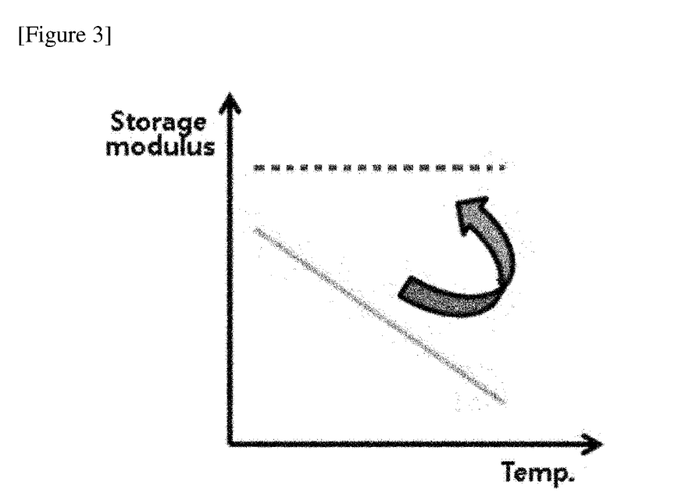
FIG. 3 is a diagram illustratively showing a storage elastic modulus graph depending on the temperature of the adhesive film according to the present application, which is divided into before curing (solid line) and after curing (dotted line).

The adhesive layer may have, in a graph (X-axis: temperature, Y-axis: storage elastic modulus) of storage elastic moduli depending on temperatures, where the X-axis is a temperature and the Y-axis is a storage elastic modulus, an absolute value of the slope of the storage elastic modulus with respect to the temperature before curing, greater than an absolute value of the slope of the storage elastic modulus with respect to the temperature after curing. Here, the storage elastic modulus may be measured at a temperature range of 25° C. to 65° C. under conditions of a strain of 5% and a frequency of 1 Hz. Otherwise, a ratio (A/B) of the absolute value (A) of the slope of the storage elastic modulus with respect to the temperature after curing to the absolute value (B) of the storage elastic modulus with respect to the temperature before curing may be in a range of 0.001 to 0.9 or 0.001 to 0.8. Generally, as the temperature increases, the polymer has a lower storage elastic modulus, where the adhesive layer of the present application can realize excellent step filling property in a vacuum heat cohesion condition applied to a substrate by maintaining the large absolute value of the slope before curing (solid line) to have a low storage elastic modulus at a high temperature, as shown in FIG. 3. In addition, the present application also maintains a high storage elastic modulus at a high temperature by keeping the slope small after curing (dotted line), and thus can realize heat resistant durability at high temperature and high humidity by being applied to a flexible organic electronic device.

In one example, the adhesive layer may have a viscosity measured depending on shear stress in conditions of a temperature at any one point of 50° C. to 70° C., a strain of 5% and a frequency of 1 Hz before curing in a range of 100 Pa·s to $10^4$ Pa·s, or 500 Pa·s to 8,000 Pa·s. In the application of the organic electronic device, the adhesive satisfying the above viscosity range can realize excellent step filling property in the vacuum heat cohesion condition. That is, in encapsulating the entire surface of the organic electronic element formed on the substrate with the adhesive, the present application can realize, in the above viscosity range, excellent filling property between the element and the substrate by the adhesive without any space at step portions generated by forming the element.

In the present application, the term "polymer derived from butylene" may mean that at least one of the polymerized units of the polymer is composed of butylene. Since the polymer derived from butylene has a very low polarity, is transparent, and has almost no influence of corrosion, excellent moisture barrier characteristics and endurance reliability can be realized when used as an encapsulant or a sealing material.

In the present application, the polymer derived from butylene may be also a homopolymer of a butylene monomer; a copolymer obtained by copolymerizing another monomer polymerizable with a butylene monomer; a reactive oligomer using a butylene monomer; or a mixture thereof. In the present application, the derived polymer may mean that the monomer forms a polymer in polymerized units. The butylene monomer may include, for example, 1-butene, 2-butene or isobutylene.

Another monomer polymerizable with the butylene monomer or a derivative thereof may include, for example, an olefin-based compound such as isoprene, styrene or butadiene. By using the copolymer, physical properties such as processability and degree of cross-linking can be maintained, whereby the heat resistance of the adhesive itself can be ensured when applied to organic electronic devices.

In addition, the reactive oligomer using the butylene monomer may include a butylene polymer having a reactive functional group. The butylene polymer may be associated with another polymer having a reactive functional group. The other polymer may be, but is not limited to, alkyl (meth)acrylate. The reactive functional group may be a hydroxy group, a carboxyl group, an isocyanate group or a nitrogen-containing group. In addition, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In one example, as the polymer, polyisobutylene, a copolymer of isobutylene and isoprene, a copolymer of isoprene and styrene, a copolymer of isobutylene and styrene, a copolymer of butadiene and styrene, a copolymer of isoprene, butadiene and styrene, polyisoprene, polybutadiene or a copolymer of isoprene and styrene, a copolymer of butadiene and styrene, or a copolymer of isoprene, butadiene and styrene can be exemplified.

In the present application, the polymer may have a weight average molecular weight (MW) such an extent that the adhesive composition can be formed into a film shape. For example, the polymer may have a weight average molecular weight of about 10,000 to 2,000,000, 50,000 to 1,000,000, 80,000 to 500,000, or 100,000 to 300,000 or so. In the present application, the term weight average molecular weight means a value converted to standard polystyrene as measured by GPC (Gel Permeation Chromatograph). However, the polymer does not necessarily have the above-mentioned weight average molecular weight, and for example, even when the molecular weight of the polymer is not in such level to form a film, a separate binder resin may be formulated into the adhesive composition.

As described above, the adhesive layer of the present application may comprise a curable oligomer. The adhesive composition according to the present application may optionally use the above-mentioned curable oligomer instead of a tackifier to be described below. That is, the adhesive layer according to the present application may comprise no tackifier.

In one example, the curable oligomer may comprise at least one or more curable functional groups. The curable functional group may be one or more selected from, for example, a glycidyl group, an isocyanate group, a hydroxy group, a carboxyl group, an amide group, an epoxide group, a cyclic ether group, a sulfide group, an acetal group and a lactone group.

In one example, the curable oligomer may have a weight average molecular weight in a range of 400 to 10,000, 500 to 10,000, 800 to 10,000, 1,000 to 10,000, 2,000 to 9,000, or 3,000 to 8,000. Within the above molecular weight range, the adhesive layer of the present application may be cured to have excellent moisture barrier characteristics and may be applied to flexible organic electronic devices to realize excellent heat resistance and adhesion. Flexible organic electronic devices can cause stress during the folding process, whereby some portions can be peeled off, and be vulnerable to high temperatures. However, the organic electronic device with which the adhesive film according to the present application is encapsulated can alleviate the stress, maintain excellent adhesive force even under severe conditions, and achieve heat resistant durability at high temperature and high humidity.

In one embodiment of the present application, the curable oligomer may be a hydrogenated compound. The term hydrogenated compound herein may mean a compound obtained by adding hydrogen to unsaturated bonds in an organic compound, for example, a carbon-carbon double bond or triple bond or a multiple bond such as a carbonyl group. In an embodiment of the present application, the hydrogenated compound may inhibit yellowing of the adhesive at high temperatures.

In one example, the curable oligomer contains two or more functional groups and may be an epoxy oligomer having an epoxy equivalent of 100 g/eq to 1,500 g/eq, 150 g/eq to 1,400 g/eq, 200 g/eq to 1,200 g/eq, or 300 g/eq to 1,000 g/eq. The present application can effectively maintain properties such as adhesion performance and glass transition temperature of a cured product by using an epoxy oligomer having an epoxy equivalent in the above range.

In one example, the curable oligomer may have a cyclic structure within the molecular structure. The cyclic structure may comprise, for example, an aromatic group (e.g., a phenyl group). For example, the curable oligomer of the present application may be a hydrogenated aromatic epoxy compound. A specific example of the aromatic group-containing curable oligomer that can be used in the present application may be an oligomer type such as a biphenyl type epoxy resin, a dicyclopentadiene type epoxy resin, a naphthalene type epoxy resin, a dicyclopentadiene modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin, but is not limited thereto.

In one example, the curable oligomer may be an oligomer shape such as 3,4-epoxycyclohexylmethyl 3',4'-epoxycyclohexanecarboxylate (EEC) and derivatives, dicyclopentadiene dioxide and derivatives, 3-ethyl-3-oxetane methanol and derivatives, diglycidyl tetrahydrophthalate and derivatives, diglycidyl hexahydrophthalate and derivatives, 1,2-ethanediglycidyl ether and derivatives, 1,3-propanediglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyldioxide and derivatives, 1,4-cyclohexanedimethanol bis(3,4-epoxycyclohexanecarboxylate) and derivatives, diglycidyl 4,5-epoxytetrahydrophthalate and derivatives, bis[1-ethyl (3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxy phenol novolak, hydrogenated epoxy phenol novolak, epoxy cresol novolak, hydrogenated epoxy cresol novolak, 2-(7-oxabicyclospiro(1,3-dioxane-5,3'-(7-oxabicylco[4.1.0]heptane)) or 1,4-bis((2,3-epoxypropoxy)-methyl)cyclohexane. An example of the curable oligomer may include, as a commercially available product, ST-3000 and ST-5000 from Kukdo Chemical, and YX-8000 and YX-8034 from Mitsubishi.

The curable oligomer may be included in an amount of 15 to 100 parts by weight, 20 to 80 parts by weight, or 20 to 70 parts by weight relative to 100 parts by weight of the polymer derived from butylene. Within the above weight range, the present application can achieve endurance reliability at high temperature and high humidity, prevention of cracks in flexible organic electronic devices, and luminance maintaining together with excellent moisture barrier characteristics by applying the adhesive layer to encapsulate the organic electronic element.

In one example, the adhesive layer may further comprise a curable monomer. The curable monomer can be distinguished from the curable oligomer in that it is not in the oligomeric form. The curable monomer may be a cationic initiating monomer. An exemplary curable monomer may have a weight average molecular weight in a range of less than 400, 50 to 390, or 100 to 350.

In one example, the curable monomer may comprise at least one or more curable functional groups. The curable functional group may be one or more selected from, for example, a glycidyl group, an isocyanate group, a hydroxy group, a carboxyl group, an amide group, an epoxide group, a cyclic ether group, a sulfide group, an acetal group and a lactone group.

In one embodiment of the present application, as the curable monomer containing two or more functional groups, an epoxy compound having an epoxy equivalent of 10 g/eq to 200 g/eq, 50 g/eq to 180 g/eq, or 100 g/eq to 150 g/eq may be used. By using the epoxy compound having an epoxy equivalent in the above range, properties such as adhesion performance and glass transition temperature of the cured product can be effectively maintained.

In one example, as the curable monomer, a compound having a cyclic structure in which the ring constituent atoms in the molecular structure are in the range of 3 to 10, 4 to 9, or 5 to 8 may be used, but is not limited thereto. In one example, the curable monomer may be an alicyclic epoxy compound having the cyclic structure.

An example of the curable monomer is 3,4-epoxycyclohexylmethyl 3',4'-epoxycyclohexanecarboxylate (EEC) and derivatives, dicyclopentadiene dioxide and derivatives, 3-ethyl-3-oxetane methanol and derivatives, diglycidyl tetrahydrophthalate and derivatives, diglycidyl hexahydrophthalate and derivatives, 1,2-ethanediglycidyl ether and derivatives, 1,3-propanediglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyldioxide and derivatives, 1,4-cyclohexanedimethanol bis(3,4-epoxycyclohexanecarboxylate) and derivatives, diglycidyl 4,5-epoxytetrahydrophthalate and derivatives, bis[1-ethyl (3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxy phenol novolak, hydrogenated epoxy phenol novolak, epoxy cresol novolak, hydrogenated epoxy cresol novolak, 2-(7-oxabicyclospiro(1,3-dioxane-5,3'-(7-oxabicylco[4.1.0]heptane)) or 1,4-bis((2,3-epoxypropoxy)-methyl)cyclohexane.

The curable monomer may be included in an amount of 20 to 80 parts by weight, 30 to 70 parts by weight, or 35 to 60 parts by weight relative to 100 parts by weight of the polymer derived from butylene. Within the above weight range, excellent moisture barrier characteristics and adhesiveness can be realized.

In one example, when the adhesive layer comprises the curable monomer and the curable oligomer together, the curable monomer and the curable oligomer may be included in the aforementioned adhesive layer in ratios of 10 to 50 parts by weight and 20 to 70 parts by weight, or 20 to 45 parts by weight and 25 to 60 parts by weight, respectively. In another embodiment, the adhesive layer may comprise the polymer derived from butylene, the curable monomer and the curable oligomer in ratios of 40 to 100 parts by weight, 10 to 50 parts by weight and 20 to 70 parts by weight, respectively. Within the above weight range, the present application can achieve endurance reliability at high temperature and high humidity, together with excellent moisture barrier characteristics by applying the adhesive layer to encapsulate the organic electronic element, and excellent heat resistance holding ability, adhesion and prevention of cracks and luminance maintaining by applying the adhesive layer to the flexible organic electronic device.

In one example, if necessary, the adhesive layer may further comprise a tackifier, which may be a hydrogenated cyclic olefin-based polymer. As the tackifier, for example, a hydrogenated petroleum resin obtained by hydrogenating a petroleum resin can be used. The hydrogenated petroleum resin may be partially or fully hydrogenated and may be a mixture of such resins. As such a tackifier, one having excellent moisture barrier characteristics, while having good compatibility with the adhesive composition, and having low organic volatile components, can be selected. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000. The content of the tackifier can be appropriately adjusted as necessary. For example, the content of the tackifier may be included in a weight ratio of 5 parts by weight to 100 parts by weight or 20 to 40 parts by weight, relative to 100 parts by weight of the solid content of the adhesive composition.

In an embodiment of the present application, the adhesive layer may further comprise a curing agent or an initiator depending on the kind of the polymer, the curable oligomer or the curable monomer. For example, a curing agent capable of reacting with the polymer, the curable oligomer or the curable monomer, as described above, to form a cross-linked structure or the like, or a cationic initiator or a radical initiator, capable of initiating the curing reaction may be further included. As the cationic initiator, a cationic photopolymerization initiator or a cationic thermal initiator may be used.

As an exemplary curing agent, which is an epoxy curing agent known in the art, for example, one or two or more of an amine curing agent, an imidazole curing agent, a phenol curing agent, a phosphorus curing agent, an acid anhydride curing agent, and the like can be used, without being limited thereto.

In one example, as the curing agent, an imidazole compound which is solid at room temperature and has a melting point or a decomposition temperature of 80° C. or higher can be used. Such a compound can be exemplified by, for example, 2-methylimidazole, 2-heptadecylimidazole, 2-phenylimidazole, 2-phenyl-4-methylimidazole or 1-cyanoethyl-2-phenylimidazole, and the like, but is not limited thereto.

The content of the curing agent may be selected depending on composition of the composition, for example, the type and ratio of the polymer, the curable oligomer or the curable monomer. For example, the curing agent may be included in an amount of 0.01 to 20 parts by weight, 0.1 to 10 parts by weight or 1 to 5 parts by weight, relative to 100 parts by weight of the solid content of the adhesive composition. However, the weight ratio may be changed depending on the type and ratio of the functional group of the curable oligomer or the curable monomer or the compound, the cross-linking density to be achieved, and the like.

In one example, as the cationic photopolymerization initiator, an ionized cationic initiator of onium salt or organometallic salt series or a non-ionized cationic photopolymerization initiator of organic silane or latent sulfonic acid series may be used. As the initiator of onium salt series, diaryliodonium salt, triarylsulfonium salt or aryldiazonium salt, and the like can be exemplified, as the initiator of organometallic salt series, iron arene and the like can be exemplified, as the initiator of organosilane series, o-nitrobenzyl triaryl silyl ether, triaryl silyl peroxide or acyl silane, and the like can be exemplified, and as the initiator of latent sulfuric acid series, α-sulfonyloxy ketone or α-hydroxymethylbenzoin sulfonate, and the like can be exemplified, without being limited thereto.

In one example, the initiator may be included in an amount of 0.01 parts by weight to 20 parts by weight, 0.1 parts by weight to 10 parts by weight or 1 part by weight to 5 parts by weight, relative to 100 parts by weight of the solid content of the adhesive composition.

The adhesive layer of the present application may further comprise a high molecular weight resin. The high molecular weight resin can play a role of improving moldability, when the adhesive layer of the present application is molded into a film or sheet shape. In addition, it can serve as a high-temperature viscosity controlling agent for controlling flowability.

The type of the high molecular weight resin that can be used in the present application is not particularly limited as long as it is compatible with other components such as the polymer. A specific example of the high molecular weight resin that can be used may include, as a resin having a weight average molecular weight of 20,000 or more, one or a mixture of two or more of a phenoxy resin, an acrylate resin, a high molecular weight epoxy resin, a ultrahigh molecular weight epoxy resin, a high polar functional group-containing rubber and a high polar functional group-containing reactive rubber, and the like, but is not limited thereto.

When the high molecular weight resin is included in the adhesive layer of the present application, the content thereof is not particularly limited as it is controlled depending on the intended physical properties. For example, in the present application, the high molecular weight resin may be included in an amount of up to about 200 parts by weight, preferably up to 150 parts by weight, more preferably up to about 100 parts by weight, relative to 100 parts by weight of the polymer derived from butylene, and the lower limit is not particularly limited, but may be 30 parts by weight or more, or 50 parts by weight or more. In the present application, by controlling the content of the high molecular weight resin to 200 parts by weight or less, compatibility with each component of the resin composition can be effectively maintained.

The adhesive layer of the present application may comprise a moisture adsorbent, if necessary. The term "moisture adsorbent" can be used generically to refer to components capable of adsorbing or removing moisture or humidity introduced from the outside through physical or chemical reactions or the like. That is, it means a moisture-reactive adsorbent or a physical adsorbent, and a mixture thereof can be also used.

The moisture-reactive adsorbent chemically reacts with humidity, moisture or oxygen, and the like introduced into the adhesive to adsorb moisture or humidity. The physical adsorbent can lengthen a moving route of moisture or humidity penetrating into the encapsulation structure to suppress the permeation, and can maximize the barrier characteristics against moisture and humidity through interaction with the matrix structure of the adhesive resin and the moisture-reactive adsorbent.

The specific kind of the moisture adsorbent which can be used in the present application is not particularly limited, and for example, the moisture-reactive adsorbent may include one or a mixture of two or more of a metal powder such as alumina, a metal oxide, a metal salt or phosphorus pentoxide ($P_2O_5$), and the like, and the physical adsorbent may include silica, zeolite, titania, zirconia or montmorillonite, and the like.

Here, a specific example of the metal oxide may include alumina, lithium oxide ($Li_2O$), sodium oxide ($Na_2O$), barium oxide (BaO), calcium oxide (CaO) or magnesium oxide (MgO), and the like, and an example of the metal salt may include a sulfate salt such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, without being limited thereto.

In the present application, the moisture adsorbent such as the metal oxide can be formulated into the composition in a properly processed state. For example, an adhesive made of the above-mentioned adhesive composition in the form of a film can be formed into a thin film having a thickness of 30

μm or less depending on the kind of the organic electronic device to be applied, where a process of pulverizing the moisture adsorbent may be required. For pulverizing the moisture adsorbent, a process such as three roll mill, bead mill or ball mill may be used.

The adhesive layer of the present application may comprise the moisture adsorbent in an amount of 0 parts by weight to 100 parts by weight, 1 to 90 parts by weight, 5 parts by weight to 80 parts by weight, or 10 to 60 parts by weight, relative to 100 parts by weight of the polymer derived from butylene. The moisture adsorbent may not be included as an optional component, but preferably by controlling the content of the moisture adsorbent to 5 parts by weight or more, the cured product may exhibit excellent moisture and humidity barrier characteristics. In addition, by controlling the content of the moisture adsorbent to 100 parts by weight or less, it may exhibit excellent moisture barrier characteristics, while forming a thin film encapsulation structure.

In this specification, unless otherwise specified, the unit "part by weight" means a weight ratio between the respective components.

The adhesive layer of the present application may optionally comprise a filler, preferably an inorganic filler. The filler can lengthen the moving route of moisture or humidity penetrating into the encapsulation structure to suppress the penetration, and can maximize the barrier characteristics against moisture and humidity through the interaction with the matrix structure of the resin component and the moisture adsorbent. The specific kind of the filler that can be used in the present application is not particularly limited, and for example, one or a mixture of two or more of clay, or talc, and the like may be used.

In the present application, in order to increase the bonding efficiency between the filler and the organic binder, a product surface-treated with an organic material may be used as the filler, or an additional coupling agent may be added thereto and used.

The adhesive layer of the present application may comprise 0 to 50 parts by weight, 1 to 40 parts by weight, or 1 to 20 parts by weight of the filler, relative to 100 parts by weight of the polymer derived from butylene. In the present application, the filler may not be included in the adhesive as an optional component, but preferably by controlling it to 1 part by weight or more, an encapsulation structure having excellent moisture or humidity barrier characteristics and mechanical properties may be provided. In addition, by controlling the filler content to 50 parts by weight or less in the present application, it is possible to provide a cured product which can be produced in the form of a film and exhibits excellent moisture barrier characteristics even when formed into a thin film.

Furthermore, in one example, the adhesive layer may further comprise a dispersing agent so that a moisture adsorbent or the like can be uniformly dispersed. As the dispersing agent that can be used here, for example, a nonionic surfactant having affinity with the surface of the moisture adsorbent and good compatibility with the adhesive resin, and the like can be used.

The adhesive layer according to the present application may comprise, in addition to the above-described configurations, various additives in accordance with applications, the type of the resin component and the manufacturing process of the adhesive layer described below, within the range that the above-described effect of invention is not affected. For example, the adhesive layer may comprise a coupling agent, a cross-linking agent, a curable material, an ultraviolet stabilizer or an antioxidant, and the like in an appropriate range of content depending on the desired physical properties.

In one example, the adhesive layer may be a multi-layer structure. For example, the adhesive layer may have a structure of two or more layers, and the composition of the two adhesive layers may be the same or different.

In an embodiment of the present application, the adhesive layer may have a storage elastic modulus, as measured in conditions of a temperature of 25° C., a strain of 5% and a frequency of 1 Hz after curing, in a range of $10^5$ to $10^9$ Pa, 0.5 MPa to 800 MPa or 0.8 MPa to 500 MPa. By controlling the physical properties of the adhesive layer within the above elastic modulus range, the present application can effectively suppress the stress in each layer constituting the flexible organic electronic device, and suppress the luminance change rate according to Equation 1 described below to provide a reliable organic electronic device.

The structure of the adhesive film of the present application is not particularly limited, but in one example, the adhesive film may have a structure comprising a base film or release film (hereinafter, often referred to as "first film"); and an adhesive layer formed on the base film or the release film.

In addition, the adhesive film of the present application may further comprise a base film or release film (hereinafter, often referred to as "second film") formed on the adhesive layer.

The specific kind of the first film that can be used in the present application is not particularly limited. As the first film in the present application, for example, a general polymer film in this field can be used. In the present application, for example, as the base or release film, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable release treatment may be also performed on one or both surfaces of the base film or release film of the present application. As an example of the releasing agent used in the release treatment of the base film, an alkyd type, a silicone type, a fluorine type, an unsaturated ester type, a polyolefin type or a wax type, and the like can be used, and it is preferred to use an alkyd type, a silicone type or a fluorine type releasing agent among them, but is not limited thereto.

The kind of the second film (hereinafter, often referred to as "cover film") that can be used in the present application is not particularly limited either. For example, in the present application, as the second film, the type that is the same as or different from the first film may be used within the scope exemplified in the first film described above. Furthermore, in the present application, the second film may also be subjected to appropriate release treatment and used.

In the present application, the thickness of the base film or the release film (first film) as above is not particularly limited and can be appropriately selected depending on the applied applications. For example, in the present application, the first film may have a thickness of 10 μm to 500 μm, preferably 20 μm to 200 μm or so. If the thickness is less than 10 μm, the base film may be easily deformed during the manufacturing process, whereas if the thickness exceeds 500 μm, the economical efficiency is lowered.

In addition, the thickness of the second film in the present application is also not particularly limited. In the present application, for example, the thickness of the second film may be also set to be the same as that of the first film. In the present application, the thickness of the second film may be also set to be relatively thinner than the first film in consideration of processability and the like.

The thickness of the adhesive layer included in the adhesive film of the present application is not particularly limited and can be appropriately selected in accordance with the following conditions in consideration of the application to which the film is applied. The adhesive layer included in the adhesive film of the present application may have 5 μm to 200 μm, preferably 10 μm to 150 μm or so.

Figure 1:
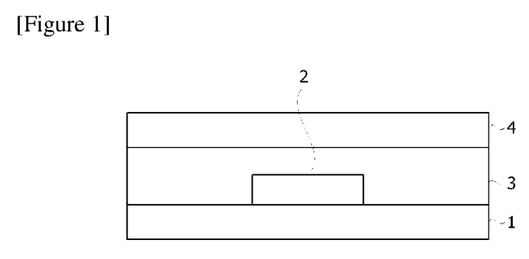
FIGS. 1 and 2 are cross-sectional views illustrating exemplary organic electronic devices.
Figure 2:
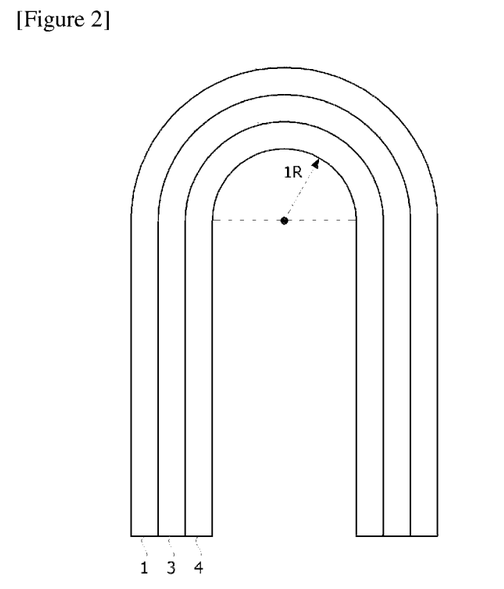

The present application also relates to a flexible organic electronic device. The organic electronic device may comprise the above-mentioned adhesive film. As shown in FIG. 1 or 2, an exemplary flexible organic electronic device may comprise a substrate (1) in which an organic electronic element (2) is present on one side and an adhesive film (3) attached in a state covering the entire surface of the organic electronic element (2) on the substrate (1). However, without being limited to above, the adhesive film may be formed on the lower part of the substrate (1). In addition, the organic electronic device may further comprise a cover substrate (4) formed on the adhesive film (3). Furthermore, the organic electronic device may comprise one or more folding portions. For example, FIG. 2 illustrates the organic electronic device having one folding portion, in which the folding portion is folded with a curvature radius of 1R. Also, the folding portion may satisfy Equation 1 below.

$$X \leq 10\% \qquad \text{[Equation 1]}$$

In Equation 1, X is a luminance change rate before and after a folding test in which a process of folding the folding portion of the organic electronic device to a curvature radius of 1R (1 mm) at a temperature at any one point of 15° C. to 35° C., for example, a temperature of 25° C. and the humidity at any one point of 30% to 80%, for example, a relative humidity of 50%, is repeated 100,000 times. The folding test is not limited to the above, and can be carried out by folding it 10,000 to 200,000 times with any one radius of 0.1R to 3R. Here, the change rate of luminance can be measured by measuring luminance A of the folding portion before the folding test and luminance B after the folding test, using the DISPLAY COLOR ANALYZER (CA-210, KONICA MINOLTA) equipment as a luminance meter, and calculating the change rate $|(A-B)/A| \times 100$. In Equation 1 above, X may be 8% or less or 5% or less, and the lower limit is not particularly limited, but may be 0%. The organic electronic device according to the present application has flexible characteristics and can effectively suppress cracks that may occur in the organic electronic device, despite the folding process of 100,000 times or more as described above, and can maintain excellent luminance.

The term "folding portion" herein may mean any one portion of an organic electronic device that can be folded such that the organic electronic device has a curvature radius of 0.1R to 3R. The folding portion can be seen as a straight line when the organic electronic device is viewed in a plan view, but is not limited thereto. The unit R can be used in the same manner as mm, which is a length unit, and 1R can mean that the curvature radius is 1 mm, when the folding portion has been folded. Furthermore, the folding process may mean a process of folding the folding portion. As described above, the organic electronic device of the present application may have one folding portion, but is not limited thereto, and for example, two or more folding portions. Also, the flexible organic electronic device of the present application can be folded without limitation to any region, by having folding portions on all the entire surface of the device.

As described above, the organic electronic device may further comprise a cover substrate. Here, the adhesive layer can adhere the surface of the substrate on which the organic electronic element exists and the cover substrate. In the present application, the substrate or the cover substrate may be a polymer film. The material of the polymer film is not particularly limited, and the above-mentioned polymer film can be exemplified.

In one example, if the physical properties of the adhesive film measured herein are physical properties varying by the temperature, they may be physical properties measured at room temperature, unless otherwise specified. The room temperature herein may mean a natural temperature that the temperature is not increased nor reduced, and for example, the temperature at any one point of about 15° C. to 35° C., the temperature at any one point of 20° C. to 25° C. or about 25° C.

In one example, the adhesive layer of the present application may have a peel force (peeling speed: 0.3 m/min, peeling angle: 180°) to the substrate of 1000 gf/in or more. In addition, the adhesive layer may have a peel force (peeling speed: 0.3 m/min, peeling angle: 180°) to the cover substrate of 1000 gf/in or more. Since the organic electronic device of the present application has folding portions, interface peeling may occur between the respective layers constituting the organic electronic device due to several folding, but by controlling the peeling force of the adhesive layer as above, defects due to the interface peeling can be suppressed.

Furthermore, in one example, the adhesive layer may have a coefficient of thermal expansion of less than 80 μm/m° C. The coefficient of thermal expansion can be measured in conditions of a temperature at any one point of 30° C. to 100° C., 0.1 N and 10° C./min. By controlling the coefficient of thermal expansion within the above range, the present application can prevent interface peeling or cracks caused by folding the flexible organic electronic device, and consequently, control the luminance change rate.

Also, in one example, the adhesive may have a moisture permeability of 50 $g/m^2 \cdot day$ or less, 30 $g/m^2 \cdot day$ or less, 20 $g/m^2 \cdot day$ or less, or less than 15 $g/m^2 \cdot day$. In the present application, the moisture permeability is a moisture permeability measured in the thickness direction of a cross-linked product or a cured product under 100° F. and a relative humidity of 100%, where the cross-linked product or the cured product is obtained after cross-linking or curing an adhesive described below and making the cross-linked product or cured product into a film shape having a thickness of 100 μm. In addition, the moisture permeability is measured according to ASTM F1249. In the present application, as the adhesive has the lower value of moisture permeability, the encapsulation structure exhibit more excellent performance, where the lower limit is not particularly limited, and for example may be 0 $g/m^2 \cdot day$, 1 $g/m^2 \cdot day$ or 3 $g/m^2 \cdot day$. Also, in one example, the adhesive may have a moisture content of 0.05% or less, relative to the adhesive mass, as measured according to Kal-Fischer titration. The moisture content may be a moisture content (the measurement conditions are a nitrogen gas temperature of 240° C. and a flow rate of 250 ml/min, and the measurement time is measured until the moisture measurement amount reaches 0.17 μg/s) for about 1 g of the adhesive sample by using VA-236S equipment from Mitsubishi after performing nitrogen purging for about 1 hour in the equipment and the container storage chamber, but is not limited thereto. By controlling the moisture permeability to the above range or controlling the moisture content to the above range, permeation of moisture, humidity or oxygen, and the like into the organic electronic device can be effectively suppressed.

Furthermore, in one example, the adhesive may have a dielectric constant of 4 F/m or less, or 3 F/m or less. The dielectric constant can be measured by a method known in the art, and for example, can be measured at 1 MHz by preparing an adhesive sample in a thickness of 100 μm, laminating the sample with a size of 2 cm×2 cm between copper foils, and then using an Agilent 4294A Precision Impedance Analyzer, but is not limited thereto. It is preferred that the dielectric constant does not exceed 4 F/m with respect to the response speed of the touch sensor, considering that the organic electronic device described above is applied to a display device or the like.

Also, in one example, the adhesive layer may have excellent light transmittance with respect to the visible light region. In one example, the adhesive layer of the present application may exhibit a light transmittance of 90% or more with respect to the visible light region. For example, the light transmittance may be measured at 550 nm using a UV-Vis spectrometer. Furthermore, the adhesive layer of the present application can exhibit low haze with excellent light transmittance. In one example, the adhesive layer may exhibit a haze of 3% or less, 2% or less, 1% or less, 0.8% or less, 0.5% or less, or 0.3% or less. The adhesive layer of the present application can realize excellent optical characteristics by being applied to an organic electronic device. The light transmittance or haze in the present application may be measured in accordance with JIS K7105 standard test method.

In one example, the organic electronic device of the present application can satisfy Equation 2 below.

$$Y \leq 10\%$$ [Equation 2]

In Equation 2, Y is a light transmittance change rate before and after a folding test in which a process of folding the folding portion of the organic electronic device to a curvature radius of 1R (1 mm) at a temperature at any one point of 15° C. to 35° C., for example, a temperature of 25° C. and the humidity at any one point of 30% to 80%, for example, a relative humidity of 50%, is repeated 100,000 times. The folding test is not limited to the above, and can be carried out by folding it 10,000 to 200,000 times with any one radius of 0.1R to 3R. The light transmittance can be measured at a wavelength of 550 nm using a UV-Vis spectrometer.

Furthermore, in one example, the organic electronic device of the present application can satisfy Equation 3 below.

$$Z \leq 10\%$$ [Equation 3]

In Equation 3, Z is a haze change rate before and after a folding test in which a process of folding the folding portion of the organic electronic device to a curvature radius of 1R (1 mm) at a temperature at any one point of 15° C. to 35° C., for example, a temperature of 25° C. and the humidity at any one point of 30% to 80%, for example, a relative humidity of 50%, is repeated 100,000 times. The folding test is not limited to the above, and can be carried out by folding it 10,000 to 200,000 times with any one radius of 0.1R to 3R. The haze can be measured according to the JIS K7105 standard test method. In Equation 3 above, Z may be 8% or less or 5% or less.

As described above, when the adhesive composition is cured to form an adhesive layer and the adhesive layer is applied to the flexible organic electronic device, the components constituting the adhesive composition and the contents of the respective components can be controlled in order to realize the above-described physical properties.

The organic electronic device according to the present application may comprise an organic electronic element, as described above.

The organic electronic element present on the top of the substrate region may comprise a first electrode layer and a second electrode layer, and may also comprise an organic layer present between the first and second electrode layers. The first and second electrode layers may be a hole-injection or electron-injection electrode layer commonly used in organic electronic devices. Any one of the first and second electrode layers may be formed of a hole-injection electrode layer and the other may be formed of an electron-injection electrode layer. Any one of the first and second electrode layers may be formed of a transparent electrode layer and the other may be formed of a reflective electrode layer. The hole-injection electrode layer may be formed using, for example, a material having a relatively high work function, and if necessary, may be formed using a transparent or reflective material. For example, the hole-injection electrode layer may comprise a metal, an alloy, an electrically conductive compound or a mixture of two or more thereof, having a work function of about 4.0 eV or more. As such a material, a metal such as gold, CuI, an oxide material such as ITO (indium tin oxide), IZO (indium zinc oxide), ZTO (zinc tin oxide), zinc oxide doped with aluminum or indium, magnesium indium oxide, nickel tungsten oxide, ZnO, $SnO_2$ or $In_2O_3$, a metal nitride such as gallium nitride, a metal selenide such as zinc selenide or a metal sulfide such as zinc sulfide, and the like can be exemplified. The transparent hole-injection electrode layer can also be formed by using a laminate of a metal thin film such as Au, Ag or Cu and a high refractive index transparent material such as ZnS, $TiO_2$ or ITO.

The hole-injection electrode layer may be formed by any means such as vapor deposition, sputtering, chemical vapor deposition or electrochemical means. In addition, if necessary, the formed electrode layer may be patterned through a process using known photolithography, shadow mask, or the like.

The electron-injection electrode layer can be formed using, for example, a material having a relatively low work function, and for example, can be formed using a suitable transparent or reflective material of materials used for forming the hole-injection electrode layer, without being limited thereto. The electron-injection electrode layer can also be formed using, for example, a vapor deposition method or a sputtering method, and the like, and if necessary, can be suitably patterned.

The electrode layer may be formed to have a thickness of, for example, about 90 nm to 200 nm, 90 nm to 180 nm, or about 90 nm to 150 nm or so.

An organic layer exists between the first and second electrode layers. The organic layer may comprise at least two light emitting units. In such a structure, light emitted from the light emitting unit can be emitted toward the transparent electrode layer through a process of being reflected by the reflective electrode layer.

The material constituting the light emitting unit is not particularly limited. Fluorescent or phosphorescent organic materials having various luminescent center wavelengths are known in the art, and the light emitting unit can be formed by selecting a suitable type of such known materials. As the material of the light emitting unit, a material of Alq series such as tris(4-methyl-8-quinolinolate)aluminum (III) (Alg3), 4-MAlq3 or Gaq3, a cyclopentadiene derivative such as C-545T ($C_{26}H_{26}N_2O_2S$), DSA-amine, TBSA, BTP, PAP-NPA, Spiro-FPA, $Ph_3Si$ (PhTDAOXD) or PPCP (1,2,3,4,5-pentaphenyl-1,3-cyclopentadiene), DPVBi (4,4'-bis(2,2'-diphenylyinyl)-1,1'-biphenyl), distyrylbenzene or a derivative thereof, or DCJTB (4-(dicyanomethylene)-2-tert-butyl-6-(1,1,7,7-tetramethyljulolidyl-9-enyl)-4H-pyran), DDP, AAAP, NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, $FIr_{ppy}$ (fac-tris[2-(4,5'-difluorophenyl)pyridine-C' 2,N]iridium (III)) or $Btp_2Ir(acac)$(bis(2-(2'-benzo[4,5-a]thienyl)pyridinato-N,C3') iridium(acetylactonate)), and the like can be exemplified, but is not limited thereto. The light emitting unit may also have a host-dopant system which includes the above material as a host and also includes perylene, distyrylbiphenyl, DPT, quinacridone, rubrene, BTX, ABTX or DCJTB and the like as a dopant.

The light emitting unit may also be formed by appropriately employing a kind that exhibits light emission characteristics among the electron-accepting organic compounds or electron-donating organic compounds as described below.

As long as the organic layer comprises the light emitting unit, it may be formed with various structures further comprising a variety of other functional layers known in the art. As the layer that can be included in the organic layer, an electron injecting layer, a hole blocking layer, an electron transporting layer, a hole transporting layer and a hole injecting layer, and the like can be exemplified.

The electron injecting layer or the electron transporting layer can be formed using, for example, an electron accepting organic compound. Here, as the electron-accepting organic compound, any known compound can be used without any particular limitation. As such an organic compound, a polycyclic compound or a derivative thereof such as p-terphenyl or quaterphenyl, a polycyclic hydrocarbon compound or a derivative thereof such as naphthalene, tetracene, pyrene, coronene, chrysene, anthracene, diphenylanthracene, naphthacene or phenanthrene, a heterocyclic compound or a derivative thereof such as phenanthroline, bathophenanthroline, phenanthridine, acridine, quinoline, quinoxaline or phenazine, and the like can be exemplified. Fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinyl anthracene, diaminocarbazole, pyrane, thiopyrane, polymethine, merocyanine, quinacridone or rubrene, and the like or derivatives thereof, metal chelate complex compounds disclosed in Japanese Laid-Open Patent Publication No. 1988-295695, Japanese Laid-Open Patent Publication No. 1996-22557, Japanese Laid-Open Patent Publication No. 1996-81472, Japanese Laid-Open Patent Publication No. 1993-009470 or Japanese Laid-Open Patent Publication No. 1993-017764, and the like, for example, metal complexes having at least one 8-quinolinolato or derivative thereof as a ligand, such as tris(8-quinolinolato)aluminum, bis(8-quinolinolato)aluminum, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolato-lithium, tris(5-chloro-8-quinolinolato)gallium or bis(5-chloro-8-quinolinolato)calcium, which is a metal chelated oxanoid compound, oxadiazole compounds disclosed in Japanese Laid-Open Patent Publication No. 1993-202011, Japanese Laid-Open Patent Publication No. 1995-179394, Japanese Laid-Open Patent Publication No. 1995-278124 or Japanese Laid-Open Patent Publication No. 1995-228579, and the like, triazine compounds disclosed in Japanese Laid-Open Patent Publication No. 1995-15473, and the like, stilbene derivatives or distyrylarylene derivatives, disclosed in Japanese Laid-Open Patent Publication No. 1994-203963, and the like, styryl derivatives disclosed in Japanese Laid-Open Patent Publication No. 1994-132080 or Japanese Laid-Open Patent Publication No. 1994-88072, and the like, diolefin derivatives disclosed in Japanese Laid-Open Patent Publication No. 1994-100857 or Japanese Laid-Open Patent Publication No. 1994-207170, and the like; fluorescent brightening agents such as benzooxazole compounds, benzothiazole compounds or benzoimidazole compounds; distyrylbenzene compounds such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene or 1,4-bis(2-methylstyryl)-2-ethylbenzene; distyrylpyrazine compounds such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine, dimethylidine compounds or derivatives thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidine, 9,10-anthracenediyldimethylidine, 4,4'-(2,2-di-t-butylphenylvinyl)biphenyl or 4,4'-(2,2-diphenylvinyl)biphenyl, silanamine derivatives disclosed in Japanese Laid-Open Patent Publication No. 1994-49079 or Japanese Laid-Open Patent Publication No. 1994-293778, and the like, multifunctional styryl compounds disclosed in Japanese Laid-Open Patent Publication No. 1994-279322 or Japanese Laid-Open Patent Publication No. 1994-279323, and the like, oxadiazole derivatives disclosed in Japanese Laid-Open Patent Publication No. 1994-107648 or Japanese Laid-Open Patent Publication No. 1994-092947, and the like, anthracene compounds disclosed in Japanese Laid-Open Patent Publication No. 1994-206865, and the like, oxynate derivatives disclosed in Japanese Laid-Open Patent Publication No. 1994-145146, and the like, tetraphenylbutadiene compounds disclosed in Japanese Laid-Open Patent Publication No. 1992-96990, organic trifunctional compounds disclosed in Japanese Laid-Open Patent Publication No. 1991-296595, and the like, coumarin derivatives disclosed in Japanese Laid-Open Patent Publication No. 1990-191694, and the like, perylene derivatives disclosed in Japanese Laid-Open Patent Publication No. 1990-196885, and the like, naphthalene derivatives disclosed in Japanese Laid-Open Patent Publication No. 1990-255789, and the like, phthaloperynone derivatives disclosed in Japanese Laid-Open Patent Publication No. 1990-289676 or Japanese Laid-Open Patent Publication No. 1990-88689, and the like, or styrylamine derivatives disclosed in Japanese Laid-Open Patent Publication No. 1990-25029, and the like can be also used as an electron-accepting organic compound included in the low refractive layer. In addition, the electron injecting layer can be also formed using a material such as LiF or CsF.

The hole blocking layer is a layer capable of improving the lifetime and efficiency of the element by preventing the injected holes from entering into the electron-injection electrode layer via the light emitting unit, and if necessary, can be formed in an appropriate portion between the light emitting unit and the electron-injection electrode layer by using a known material.

The hole injecting layer or the hole transporting layer may comprise, for example, an electron donating organic compound. As the electron donating organic compound, arylamine compounds such as N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quadriphenyl, 4-N,N-diphenylamino-(2-diphenylvinyl) benzene, 3-methoxy-4'-N,N-diphenylaminostylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamono)-4'-[4-(di-p-tolylamino)styryl]stilbene, N,N,N',N'-tetraphenyl-4,4'-diaminobiphenyl-N-phenylcarbozole, 4,4'-bis[N-(1-naphthyl)-N-phenylamino]biphenyl, 4,4"-bis[N-(1-naphthyl)-N-phenylamino]-p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorene or 4,4"-bis(N,N-di-p-tolylamino)terphenyl, and bis(N-1-naphthyl) (N-2-naphthyl)amine can be representatively exemplified, without being limited thereto.

The hole injecting layer or the hole transporting layer may be formed by dispersing an organic compound in a polymer, or by using a polymer derived from the organic compound. Furthermore, so-called π-conjugated polymers such as polyparaphenylenevinylene and derivatives thereof, hole-transporting non-conjugated polymers such as poly(N-vinylcarbazole) or α-conjugated polymers such as polysilanes, and the like may also be used.

The hole injecting layer may be formed by using metal phthalocyanine such as copper phthalocyanine or nonmetal phthalocyanine, or electrically conductive polymers such as a carbon film and polyaniline, or by reacting the arylamine compound as an oxidizing agent with a Lewis acid.

The specific structure of the organic layer is not particularly limited. In this field, various materials for forming a hole or electron injecting electrode layer and an organic layer, for example, a light emitting unit, an electron injecting or transporting layer, a hole injecting or transporting layer, and forming methods thereof are known, and all the above methods may be applied to manufacture the organic electronic device.

Furthermore, the organic electronic element of the present application may comprise a protective layer. The protective layer can prevent damage to the electrode, be composed of typical materials in this technical field, and for example, comprise $SiN_x$ or $Al_2O_3$, and the like as an inorganic material.

The present application also relates to a method for manufacturing the organic electronic device.

The manufacturing method may comprise steps of forming an adhesive layer comprising a polymer derived from butylene on a substrate, one surface of which an organic electronic element is present on, and curing the adhesive layer.

The term "curing" herein may mean that the adhesive composition of the present invention forms a cross-linked structure through heating or UV irradiation processes to be produced in the form of an adhesive.

Specifically, an organic electronic element may be formed by forming an electrode on a polymer film used as a substrate with a method such as vacuum deposition or sputtering, forming a luminescent organic material layer composed of, for example, a hole transporting layer, a light emitting layer and an electron transporting layer, and the like on the electrode and then further forming an electrode layer on the top. Subsequently, in the substrate performed by the above process, the above-described adhesive layer is placed on the surface on which the element is formed, so that the entire surface of the element is encapsulated. Subsequently, the adhesive layer may be formed by heating the adhesive layer and pressing it in a state where fluidity is imparted thereto, with a laminator or the like, and cross-linking the resin in the adhesive layer.

In one example, the adhesive layer positioned to cover the entire surface of the organic electronic element may be previously transferred to the cover substrate. The transfer of the adhesive layer to the cover substrate can be also carried out, for example, by heating the adhesive layer in contact with the cover substrate using a vacuum press or a vacuum laminator and the like. If the adhesive contains a thermosetting curable polymer, there is a concern that the curing reaction is excessively performed in the above process and sticking force or adhesiveness of the adhesive layer is reduced, and thus it is possible to control the process temperature to about 100° C. or less and the process time within 5 minutes.

The adhesive layer may be formed by positioning the cover substrate onto which the adhesive layer is transferred on the organic electronic element, and performing the hot pressing process.

Although one example of the method for manufacturing the organic electronic device has been mentioned above, the organic electronic device may be manufactured in other ways as well. For example, the device is manufactured in the same manner as described above, but the order or conditions of the process may be changed.

The present application also relates to a use of the organic electronic device, for example, an organic light emitting device. The organic light emitting device may be effectively applied to a backlight of a liquid crystal display (LCD), an illumination, a light source of various sensors, a printer, a copy machine, a vehicle instrument light source, a signal lamp, an indicating lamp, a display device, a light source of a planar light emitter, a display, a decoration, or various lights, and the like. In one example, the present application relates to a lighting apparatus comprising the flexible organic electronic device. In addition, the present application relates to a display device comprising the flexible organic electronic device as a light source. When the organic electronic element is applied to the lighting apparatus or other uses, other components constituting the device or the like, or the methods for constituting the device are not particularly limited, and as long as the organic electronic element is used, any material or method known in the relevant field may be employed.

Advantageous Effects

The present application provides a flexible organic electronic device that does not only realize excellent moisture barrier characteristics, but also has excellent endurance reliability under high temperature and high humidity conditions while having flexible characteristics, and provides an adhesive film applied to the flexible organic electronic device.

EXPLANATION OF REFERENCE NUMERALS

1: substrate
2: organic electronic element
3: adhesive layer or adhesive film
4: cover substrate

BEST MODE

Hereinafter, the present invention will be described in more detail with reference to Examples complying with the present invention and Comparative Examples not complying with the present invention, but the scope of the present invention is not limited by the following examples.

EXAMPLE 1

A styrene-isobutylene copolymer (SIBS 062M, Mw: 60,000, Kaneka) as a polymer derived from butylene, a hydrogenated bisphenol A epoxy resin (YX8000, epoxy equivalent: 201 g/eq, Mitsubishi Chemical) as a curable oligomer, and an alicyclic epoxy compound (Celloxide 2021P, Mw: 250, Daicel corporation) as a curable monomer were introduced into a reaction vessel at a weight ratio of 50:30:20 (SIBS 062M:YX8000:Celloxide 2021P), respectively, and Irgacure290 (Ciba) as a cationic photoinitiator was added thereto in an amount of 0.1 parts by weight, relative to 100 parts by weight of the polymer, and then diluted with toluene to a solid content of about 15% by weight to prepare an adhesive composition coating solution.

An adhesive film was produced by coating the prepared solution on the releasing surface of the releasing PET and drying it in an oven at 100° C. for 15 minutes to form an adhesive layer having a thickness of 50 μm.

EXAMPLE 2

An adhesive composition and an adhesive film were produced in the same manner as in Example 1, except that a styrene-isobutylene copolymer (SIBS 102T, Mw: 100,000, Kaneka) as a polymer derived from butylene, a hydrogenated bisphenol A epoxy resin (YX8000, epoxy equivalent: 201 g/eq, Mitsubishi Chemical) as a curable oligomer, and a silane-modified epoxy resin (KSR-177, Kukdo Chemical) as a curable monomer were introduced into a reaction vessel at a weight ratio of 60:15:25 (SIBS 102T:YX8000:KSR-177), respectively.

Comparative Example 1

Polyisobutylene (B50, BASF) as a polymer derived from butylene, a hydrogenated petroleum resin (SU90, Kolon), and 1,6-hexandediol diacrylate (M200, Miwon Commercial Co., Ltd.) were introduced into a reaction vessel at a weight ratio of 60:30:10 (B50:SU90:M200), respectively, and Irgacure654 (Ciba) as a radical initiator was added thereto in an amount of 0.1 parts by weight, relative to 100 parts by weight of the polymer, and then diluted with toluene to a solid content of about 15% by weight to prepare an adhesive composition coating solution.

An adhesive film was produced by coating the prepared solution on the releasing surface of the releasing PET and drying it in an oven at 100° C. for 15 minutes to form an adhesive layer having a thickness of 50 μm.

Comparative Example 2

An adhesive composition and an adhesive film were produced in the same manner as in Comparative Example 1, except that polyisobutylene (B50, BASF) as a polymer derived from butylene, a hydrogenated petroleum resin (SU90, Kolon), and 1,6-hexandediol diacrylate (M200, Miwon Commercial Co., Ltd.) were introduced into a reaction vessel at a weight ratio of 50:40:10 (B50:SU90:M200), respectively.

Comparative Example 3

An adhesive composition and an adhesive film were produced in the same manner as in Comparative Example 1, except that a silane-modified epoxy resin (KSR-277, Kukdo Chemical) and an alicyclic epoxy compound (Celloxide 2021P, Mw: 250, Daicel corporation) were introduced into a reaction vessel at a weight ratio of 70:30 (KSR-277:Celloxide 2021P), respectively.

Comparative Example 4

An adhesive composition and an adhesive film were produced in the same manner as in Example 1, except that a bisphenol A type phenoxy resin (YP-50, Kukdo Chemical), a high molecular weight silane-modified epoxy resin (KSR-277, Kukdo Chemical) and a silane-modified epoxy resin (KSR-177, Kukdo Chemical) were introduced into a reaction vessel at a weight ratio of 40:30:30 (YP-50:KSR-277:KSR-177), respectively.

Comparative Example 5

An adhesive composition and an adhesive film were produced in the same manner as in Example 1, except that a styrene-isobutylene copolymer (SIBS 062M, Kaneka) as a polymer derived from butylene, a hydrogenated petroleum resin (SU90, Kolon), and an alicyclic epoxy compound (Celloxide 2021P, Mw: 250, Daicel corporation) were introduced into a reaction vessel at a weight ratio of 50:30:20 (SIBS 062M:SU90:Celloxide 2021P), respectively.

Experimental Example 1—Storage Elastic Modulus after Curing

After curing the adhesive film prepared in Examples and Comparative Examples with a UV dose of 1000 mJ/cm² or at 110° C. for 1 hour, the film was laminated to a thickness of 600 µm, and physical properties were measured using ARES equipment as follows.

The storage elastic modulus was measured in conditions of a temperature of 25° C., a strain of 5% and a frequency of 1 Hz.

Experimental Example 2—Viscosity Before Curing

Before curing the adhesive film prepared in Examples and Comparative Examples, the film was laminated to a thickness of 600 µm, and physical properties were measured using ARES equipment as follows. The viscosity was measured depending on shear stress in conditions of a temperature of 65° C., a strain of 5% and a frequency of 1 Hz.

Experimental Example 3—Step Filling Property

In a simple substrate on which steps of 10 µm are formed, the adhesive film prepared in Examples and Comparative Examples was adhered to the center portion by using a roll laminator. A glass having the same size as the prepared specimen is pressed in the vertical direction and bonded together by applying a vacuum of 100 pa and a pressure of 0.5 MPa under a temperature condition of 65° C. with a vacuum bonding machine. The cohesiveness was determined depending on looseness of the step forming region in the front side of the adhesive and classified as O when the loosed portion of the step formation region is 10% or less of the total area, Δ when it is 30% or less and X when it is 50% or more.

Experimental Example 4—Presence of Cracks

A transparent electrode is formed on a polyimide substrate by a vacuum deposition method, and an organic material layer is formed on the transparent electrode. The organic material layer comprises a hole injecting layer, a hole transporting layer, a light emitting layer, an electron injecting layer and an electron transporting layer. Then, a reflective electrode is further formed on the organic material layer. Thereafter, the adhesive film prepared in Examples and Comparative Examples was sealed so as to encapsulate the entire surface of the organic electronic element on the substrate, a cover substrate was formed on the adhesive film, and then curing was carried out under the same conditions as Experimental Example 1.

For the prepared organic electronic device, the presence or absence of cracks was visually observed after the folding test in which the process of folding the folding portion of the organic electronic device to a curvature radius of 1R (1 mm) under a temperature of 25° C. and a relative humidity of 50%, is repeated 100,000 times. It was classified as O without any crack or interface separation, Δ when at least one of crack or interface separation is observed and X when observed in large quantities.

Experimental Example 5—Moisture Permeability

The adhesive composition prepared in Examples or Comparative Examples was applied to a base film (release polyester film, RS-21G, manufactured by SKC) having a thickness of 38 µm. Then, it was dried at 110° C. for 10 minutes to prepare a film-shaped layer having a thickness of 100 µm. Thereafter, the base film was peeled off, and the moisture permeability of the film-shaped layer to the thickness direction was measured in a state where the film-shaped layer was positioned at 100° F. and a relative humidity of 100%. The moisture permeability was measured in accordance with the provisions of ASTM F1249.

Experimental Example 6—Slope of Storage Elastic Modulus with Respect to Temperature Before and after Curing The physical properties before curing were measured by applying the adhesive composition prepared in Examples and Comparative Examples to the releasing surface of the releasing PET and drying it in an oven at 100° C. for 15 minutes to form an adhesive layer having a thickness of 600 µm.

The physical properties after curing were measured by curing the pressure-sensitive adhesive layer with a UV dose of 1000 mJ/cm² or at 110° C. for 1 hour.

The storage elastic modulus was measured at a temperature range of 25° C. to 65° C. under conditions of a strain of 5% and a frequency of 1 Hz.

As shown in FIG. 3, a storage elastic modulus graph for temperature was plotted and its slope was calculated.

TABLE 1

| | Storage elastic modulus after curing (MPa) | Viscosity at 65° C. before curing (Pa · s) | Step filling property | Presence of cracks | WVTR | Slope before curing | Slope after curing |
|---|---|---|---|---|---|---|---|
| Example 1 | 1.0 | 1500 | O | O | 5 | −2500 | −50 |
| Example 2 | 2.1 | 5000 | Δ | O | 5 | −1943 | 5 |
| C. Example 1 | 0.3 | 20000 | X | O | 3 | −100 | 10 |
| C. Example 2 | 0.1 | 15000 | X | X | 3 | −3000 | −2500 |
| C. Example 3 | 2000 | 300 | O | X | 20 | −50000 | −1000 |
| C. Example 4 | 700 | 1000 | O | Δ | 15 | −38000 | −10 |
| C. Example 5 | 1.0 | 1500 | O | Δ | 5 | −3300 | −5000 |

(C. Example: Comparative Example)

The invention claimed is:

1. An adhesive film comprising an adhesive layer comprising a polymer derived from butylene and a curable oligomer, wherein said adhesive layer has, in a graph wherein temperature is plotted along an X-axis and storage elastic modulus is plotted along a Y-axis, an absolute value of the slope of the storage elastic modulus with respect to the temperature before curing, is greater than an absolute value of the slope of the storage elastic modulus with respect to the temperature after curing, and said storage elastic modulus is measured at a temperature range of 25° C. to 65° C. under conditions of a strain of 5% and a frequency of 1Hz, wherein the adhesive layer has a viscosity measured depending on shear stress in conditions of a temperature at any one point of 50° C. to 70° C., a strain of 5% and a frequency of 1 Hz before curing in a range of 100 Pa·s to $10^4$ Pa·s.

2. The adhesive film according to claim 1, wherein the polymer derived from butylene is a homopolymer of a butylene monomer; a copolymer obtained by copolymerizing another monomer polymerizable with a butylene monomer; a reactive oligomer using a butylene monomer; or a mixture thereof.

3. The adhesive film according to claim 2, wherein another monomer polymerizable with a butylene monomer is isoprene, styrene or butadiene.

4. The adhesive film according to claim 2, wherein the reactive oligomer using a butylene monomer comprises a butylene polymer having a reactive functional group, and said butylene polymer is associated with another polymer having a reactive functional group.

5. The adhesive film according to claim 1, wherein the polymer derived from butylene has a weight average molecular weight in a range of 10,000 to 2,000,000.

6. The adhesive film according to claim 1, wherein the curable oligomer is a hydrogenated compound.

7. The adhesive film according to claim 1, wherein the curable oligomer is an aromatic compound.

8. The adhesive film according to claim 1, wherein the curable oligomer has a weight average molecular weight in a range of 400 to 10,000.

9. The adhesive film according to claim 1, wherein the curable oligomer is a hydrogenated aromatic epoxy compound.

10. The adhesive film according to claim 1, wherein the curable oligomer has an epoxy equivalent in a range of 100 to 1500 g/eq.

11. The adhesive film according to claim 1, wherein the curable oligomer is included in an amount of 15 to 100 parts by weight, relative to 100 parts by weight of the polymer derived from butylene.

12. The adhesive film according to claim 1, further comprising a curable monomer.

13. The adhesive film according to claim 12, wherein the curable monomer has a weight average molecular weight of less than 400.

14. The adhesive film according to claim 12, wherein the curable monomer has a cyclic structure in which ring constituent atoms in the molecular structure are in a range of 3 to 10.

15. The adhesive film according to claim 12, wherein the curable monomer is included in an amount of 20 to 80 parts by weight, relative to 100 parts by weight of the polymer derived from butylene.

16. The adhesive film according to claim 1, comprising no tackifier.

17. The adhesive film according to claim 1, wherein the adhesive layer has a storage elastic modulus, as measured in conditions of a temperature of 25° C., a strain of 5% and a frequency of 1 Hz after curing, in a range of $10^5$ Pa to $10^9$ Pa.

18. A flexible organic electronic device comprising a substrate in which an organic electronic element is formed on one surface, and the adhesive film according to claim 1 attached in a state covering the entire surface of said organic electronic element on said substrate.

19. The flexible organic electronic device according to claim 18, comprising at least one folding portion satisfying Equation 1 below:

$$X \leq 10\% \qquad \text{[Equation 1]}$$

wherein, X is a luminance change rate before and after a folding test in which a process of folding the folding portion of said organic electronic device to a curvature radius of 1 R (1 mm) at a temperature of 25° C. and a relative humidity of 50%, is repeated 100,000 times.

20. The flexible organic electronic device according to claim 18, further comprising a cover substrate, wherein the adhesive layer adheres the surface of said substrate on which the organic electronic element exists and said cover substrate.

* * * * *